United States Patent [19]
Owen et al.

[11] 3,934,326
[45] Jan. 27, 1976

[54] ELECTRIC METER INSTALLING DEVICE

[75] Inventors: Donald W. Owen, Norman; Richard D. Pooler, Oklahoma City, both of Okla.

[73] Assignee: Southwest Electric Company, Oklahoma City, Okla.

[22] Filed: Oct. 2, 1974

[21] Appl. No.: 511,224

[52] U.S. Cl. ................................................ 29/278
[51] Int. Cl.² ............................................ B25B 27/02
[58] Field of Search.................... 29/270, 278, 283; 294/64 R

[56] References Cited
UNITED STATES PATENTS

| | | | |
|---|---|---|---|
| 2,162,819 | 6/1939 | McKechnie et al..................... | 29/278 |
| 2,919,696 | 1/1960 | Rinaldy.................................. | 294/64 |
| 3,044,158 | 7/1962 | Bushnell................................ | 29/278 |
| 3,570,103 | 3/1971 | Price..................................... | 29/270 |

FOREIGN PATENTS OR APPLICATIONS

| 397,180 | 2/1966 | Switzerland....................... | 294/64 R |
|---|---|---|---|

*Primary Examiner*—Al Lawrence Smith
*Assistant Examiner*—Harold P. Smith, Jr.
*Attorney, Agent, or Firm*—Laney, Dougherty, Hessin & Fish

[57] ABSTRACT

An electric meter installing device which includes an annular shield plate having detachably secured thereto, a generally cylindrical housing. A pair of handles project from opposite sides of the housing and are spaced from the shield plate. A suction cup is mounted in the opposite side of the housing from that which is adjacent, and detachably connected to, the shield plate. A backup ring is secured to the inside of the housing and extends concentrically around the suction cup. The backup ring functions as a stop or abutment contacting one side of an electrical meter housing during installation with the device of the invention. A protuberant finger extends from one edge of the suction cup through the housing to permit the suction cup to be released from engagement with the housing of the electric meter to be installed.

24 Claims, 5 Drawing Figures

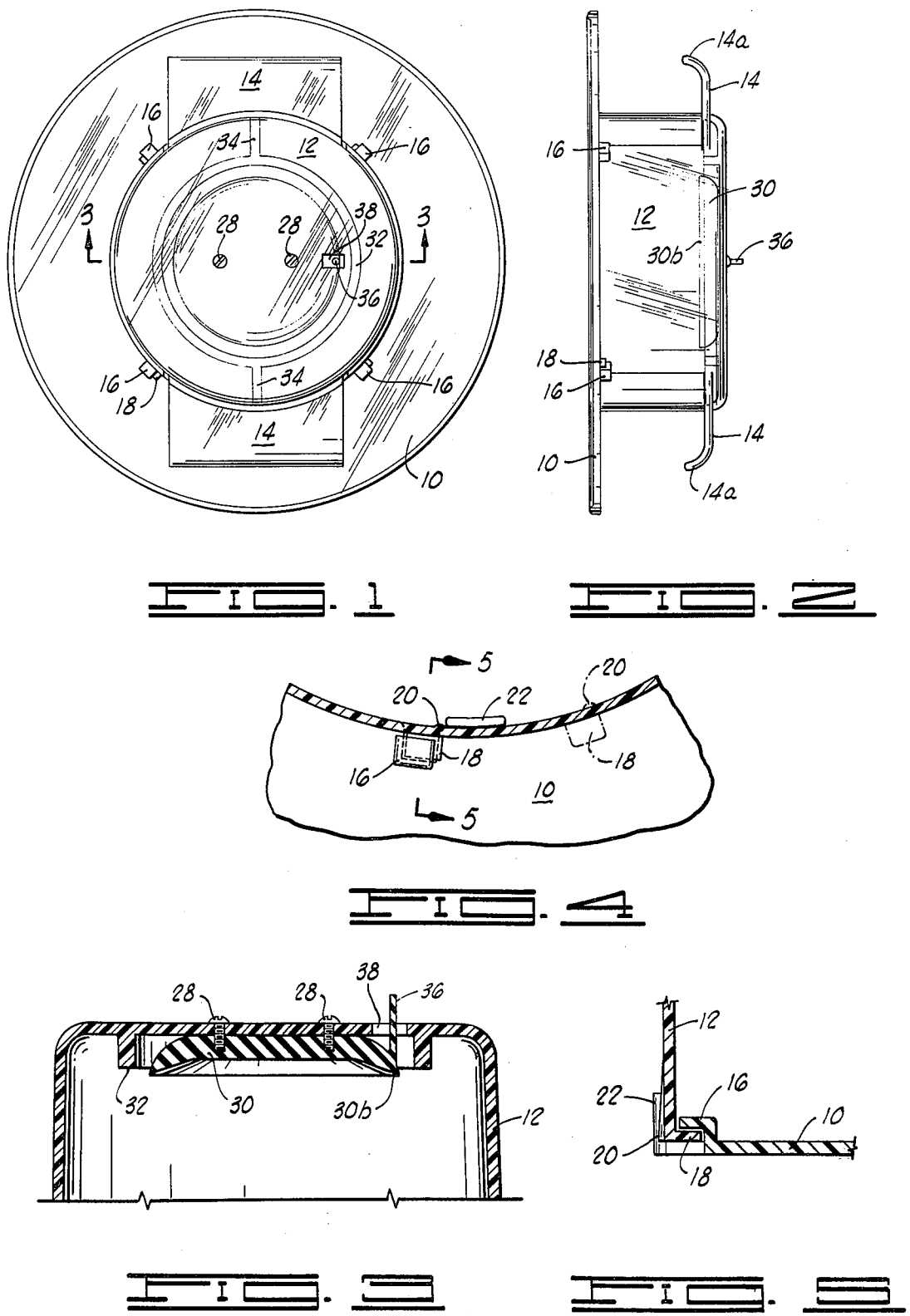

ELECTRIC METER INSTALLING DEVICE

BACKGROUND OF THE INVENTION

1. Field of the Invention

This invention relates to devices for manually positioning, installing and withdrawing electric meters of the type having a glass housing surrounding the meter mechanism and dials, and more particularly, to installing devices for installing such meters while the glass meter housing is enclosed within a protective enclosure which is manually manipulated in positioning the meter during installation.

2. Brief Description of the Prior Art

A device for manually installing glass housed electric meters is disclosed in Price, U.S. Pat. No. 3,570,103. The Price meter installing device includes an annular rim or collar which is adapted to bear against or abut the rim of the glass housing enclosing an electric meter which is to be installed. Extending outwardly from the collar so as to form a basket or framework extending around the glass housing of the meter are a plurality of support members in the form of metal straps. These straps carry a plurality of cushioning pads disposed on the ends of screws extended through the straps, which cushioning pads can be screwed into engagement with the sides of the glass meter housing. When the glass housed meter is positioned inside this device, it is gripped by the cushioning pads and by the annular collar, and can be manually positioned by holding the straps of the device and guiding the glass meter to the proper position of installation.

BRIEF DESCRIPTION OF THE PRESENT INVENTION

The present invention provides an improved glass meter installing device which protects the glass housing of a meter from fracturing, cracking or breakage during installation or withdrawal, and at the same time, protects installing personnel from explosions and electrical shock which occasionally occur in the course of installing or withdrawing electric meters by prior methods and using devices heretofore known. Further, the meter installing device of the invention is versatile in its usage and can be employed for installing or withdrawing meters in open spaces while affording a relatively great amount of protection to installing personnel, or can be modified to permit the meter to be installed or withdrawn in a rather narrow or confined space.

Broadly described, the meter installing device of the present invention comprises an annular shield plate having a generally cylindrical housing detachably secured to the shield plate around a large central opening through the center of the plate. The housing carries a pair of handles which project from opposite sides of the housing, and substantially parallel to the annular shield plate. There is further provided at one side of the housing, opposite the opening through the annular shield plate, a resilient suction cup which projects inwardly into the housing and is adapted for engaging the exposed outer side of the housing of an electric meter to be installed. A backup or stop ring is formed on the side of the housing which carries the suction cup, and surrounds the suction cup to afford a firm backup to the housing of the electric meter as it is pressed into its installed position.

From the foregoing description of the invention, it will be seen that the present invention provides an improved meter installing device which completely encloses and shields the meter during its installation, and prevents breaking of the glass meter housing or injury to personnel installing or withdrawing the meter as a result of electrical shock, electrical arc or inadvertent breaking or explosion of the meter shattering the glass housing thereof.

A further object of the invention is to provide a meter installing device which can be utilized with a significant measure of protection and safety in all usages, and which can be employed to emplace the meter in restricted or confined locations.

An additional object of the invention is to provide a meter installing device which grips the meter with a soft, resilient suction cup during installation, so that the glass housing of the meter is not scratched or broken through contact with hard or abrasive surfaces.

A further object of the invention is to provide a meter installing device which is of simple construction, yet which is mechanically durable and characterized in having a long and trouble-free service life.

Additional objects and advantages of the invention will become apparent as the following detailed description of one embodiment of the invention is read in conjunction with the accompanying drawing which illustrates the invention.

GENERAL DESCRIPTION OF THE DRAWING

FIG. 1 is a plan view of the meter installing device of the invention.

FIG. 2 is a side elevation view of the meter installing device illustrated in FIG. 1.

FIG. 3 is a sectional view taken along line 3—3 of FIG. 1.

FIG. 4 is a sectional view taken in a horizontal plane extended through the cylindrical housing of the installing device at a location just above the interlocking lugs provided for detachably connecting this housing to the annular shield plate forming a part of the installing device.

FIG. 5 is a sectional view taken along line 5—5 of FIG. 4.

DETAILED DESCRIPTION OF ONE EMBODIMENT OF THE INVENTION

The meter installing device of the invention includes an annular shield plate 10 which has a large central opening formed therethrough of a diameter which is substantially equal to the diameter of a generally cylindrical housing 12. It will be noted in referring to FIGS. 1–3 that both the annular shield plate 10 and the housing 12 are formed of a synthetic resin material which is preferably transparent in character and is characterized by high impact strength and resistance. The generally cylindrical housing 12 has formed integrally therewith, and extending from opposite sides thereof, a pair of handles 14 which have downwardly curved end portions 14a allowing a two-handed grip of the installing device during use.

The housing 12 is detachably secured to the annular shield plate 10 by means of a plurality of interlocking lugs best illustrated in FIGS. 2, 4 and 5 of the drawings. Thus, the annular shield plate 10 carries, in the illustrated embodiment, four built-up, undercut female lugs 16. Each of the lugs 16 is open at the radially inner side and at one side extending normal thereto, so that a mating male tab 18 carried near the edge of the generally cylindrical housing 12 adjacent the open side thereof can slide into, and interlock with one of the lugs 16 in the manner shown in FIGS. 4 and 5. It will be noted in referring to FIG. 4 that the male tab 18 projects radially outwardly from the side wall of the generally cylindrical housing 12 at the edge adjacent the open side of the housing, and that there is further provided, a small, generally semi-cylindrical protuberance 20 which projects radially inwardly from the cylindrical housing at the same location, and immediately opposite the trailing edge of each male tab 18.

In referring to FIG. 4, it will also be noted that the female lug 16 is displaced radially outwardly a short distance from the periphery of the large opening through the annular shield plate 10, and that the shield plate further carries an upstanding rib 22 on the periphery of the opening through the shield plate, and spaced circumferentially a short distance from the respective female lug. The described arrangement permits snap interlocking between the male tab 18 and the female lug 16, and between the protuberance 20 and the rib 22 as shown in full lines in FIG. 4. Prior to the attainment of this interlocking status, the male tab 18 and the protuberance 20 are shifted circumferentially around the annular shield plate 10 from the interlocking position, as shown in dashed lines in FIG. 4, and interlocking is achieved by rotation of the cylindrical housing 12 on the annular shield plate 10 until snap engagement is achieved in which the protuberance 20 engages the rib 22, and the male tab 18 is positioned within and under the female lug 16. Four such points of engagement are provided by the inclusion of four sets of each of the interlocking members as described, with the four interlocks being best illustrated in FIG. 1 of the drawing.

Secured to the top side of the cylindrical housing 12 by means of a pair of suitable screws or bolts 28 is a soft, flexible and resilient suction cup 30. The base of the suction cup 30 bears against the top side of the cylindrical housing 12, and the peripheral gripping edge 30b of the suction cup is spaced inwardly from the top wall of the housing 12. Extending around the outer periphery of the suction cup 30 in concentric relation thereto is a backup or supporting ring 32. The supporting ring 32 is preferably molded integrally with the housing 12, and is rigidly interconnected with the handles 14 by a pair of ribs 34 which project radially outwardly from the ring and extend to the side walls of the cylindrical housing 12.

As shown in FIG. 3 of the drawings, the illustrated embodiment of the invention includes a small vacuum releasing finger 36 which is molded integrally with the suction cup 30 adjacent to the side edge thereof, and projects from the suction cup out through a small hole 38 formed in the top side of the housing 12. A sufficient amount of the releasing finger 36 projects beyond the housing 12 to permit the finger to be gripped for the purpose of releasing the suction cup from the housing of a meter to be installed in a manner hereinafter described.

OPERATION

The meter installing device of the invention may be used in either of two ways. Where the location where an electric meter is to be installed or withdrawn is not restricted or confined, and adequate space around the point of installation exists for using the complete assembled installing device as shown in FIG. 1, the cylindrical housing 12 is engaged with the annular shield plate 10. This is accomplished by rotation of the housing 12 on the shield plate 10 to snap engage the lugs 16 with the tabs 18, and the protuberances 20 with the ribs 22 in the manner hereinbefore described. This arrangement firmly secures the plate 10 to the housing 12.

The electric meter to be installed is next engaged by pressing the suction cup 30 against the flat outer end wall of the glass housing characteristically utilized in such electric meters. This will cause a suction to be developed within the suction cup 30 so as to engage the meter housing, and the meter housing will then extend concentrically within the generally cylindrical housing 12, with the base of the meter projecting from the front side of the housing 12. Using the handles 14a, the person undertaking the installation can then advance or project the electric meter toward the point of securement thereof on a wall or other desired location, guiding the meter as it is positioned for installation and connection, or reversing the movement of the device for meter removal or withdrawal. During this manipulation, the person installing the meter is protected against electrical shock, since the synthetic resin installing device possesses dielectric characteristics affording adequate insulation, and the installer is also protected against the occasional explosions of the glass meter housings which have been known to occur due to engagement of a meter into a faulted circuit or withdrawal of a meter while a load is being served. Further, the glass housing of the electric meter is also protected in large part by the surrounding cylindrical housing 12, and by the shielding afforded by the annular shield plate 10.

When the base of the meter being installed has been abutted against the meter socket into which installation is to be made, the flat outer side of the meter housing is brought to bear against the backup ring 32. This ring affords a firm and even support to the meter housing, and prevents undesirable excessive distortion of the suction cup 30. It also enables an even force to be applied to the meter housing at this time.

After the meter has been installed or withdrawn, it is a simple matter to release the installing device from the meter. This is accomplished merely by grasping the elastomeric releasing finger 36 and pulling outwardly. This will cause the lip at one side of the suction cup to be lifted, and the vacuum to be broken. The installing device can then be completely disengaged from the meter.

In an alternative mode of usage of the meter installing device of the invention, a cylindrical housing 12 can be quickly disengaged from the annular shield plate 10, and the housing then used alone without attachment to the shield plate. This permits the electric meter to be installed or withdrawn in a more restricted or confined space where clearance for the relatively large diameter shield plate 10 is not afforded. The mode of installation in this circumstance is then substantially the same as that previously described when both the shield plate 10 and the housing 12 are used conjunctively.

Although one form of the present invention has been herein described in order to illustrate the basic principles underlying the invention, it will be understood that various changes and innovations in the illustrated and described structure can be effected without departure from such basic principles. Changes and innovations of this type are therefore deemed to be circumscribed by the spirit and scope of the invention, except as the same may be necessarily limited by the appended claims or reasonable equivalents thereof.

We claim:

1. An electric meter installing device comprising:
   a hollow transparent housing having an opening at one side thereof;
   handles on opposite sides of the housing facilitating the lifting, handling and guidance of the housing;
   meter engaging means within the housing at the side thereof opposite said opening and secured thereto for engaging an electric meter to be installed while a portion of the meter projects through said opening; and
   releasing means accessible from outside the housing and cooperating with said meter engaging means to facilitate disengagement of an electric meter from the meter engaging means after the electric meter has been installed.

2. An electric meter installing device as defined in claim 1 and further characterized as including shield means detachably secured to said housing around the opening therein.

3. An electric meter installing device as defined in claim 2 wherein said shield means is a substantially flat transparent plate.

4. An electric meter installing device as defined in claim 2 wherein said shield means is a transparent synthetic resin and an electrical non-conductor.

5. An electric meter installing device comprising:
   a hollow transparent housing having an opening at one side thereof;
   handle means on the housing facilitating the lifting, handling and guidance of the housing;
   a suction cup within the housing and secured thereto for engaging an electric meter to be installed while a portion of the meter projects through said opening; and
   releasing means accessible from outside the housing and cooperating with said meter engaging means to facilitate disengagement of an electric meter from the meter engaging means after the electric meter has been installed.

6. An electric meter installing device as defined in claim 5 and further characterized as including a rigid backup ring concentrically surrounding said suction cup and adapted to bear against an electric meter pressed against said suction cup.

7. An electric meter installing device as defined in claim 5 and wherein said releasing means includes a releasing finger extending from said suction cup through said housing and facilitating the release of said suction cup from engagement with an electric meter to be installed.

8. An electric meter installing device as defined in claim 5 wherein said suction cup is mounted on the inside of said housing at a location opposite the opening at one side thereof and includes an annular gripping edge, and wherein said handle means includes a pair of handles extending from opposite sides of said housing in substantially the same plane as said annular gripping edge.

9. An electric meter installing device comprising:
   a hollow, cylindrical, transparent housing having an open end;
   handle means on the housing facilitating the lifting, handling and guidance of the housing;
   meter engaging means within the housing and secured to the opposite end of said housing from said open end for engaging an electric meter to be installed while a portion of the meter projects through said opening; and
   releasing means accessible from outside the housing and cooperating with said meter engaging means to facilitate disengagement of an electric meter from the meter engaging means after the electric meter has been installed.

10. An electric meter installing device as defined in claim 9 wherein said housing is an electrically non-conducting material.

11. An electric meter installing device as defined in claim 9 wherein said meter engaging means comprises means for engaging the cylindrical housing of an electric meter to hold the meter housing concentrically within said hollow transparent housing.

12. An electric meter installing device comprising:
    a hollow transparent housing having an opening at one side thereof;
    handle means on the housing facilitating the lifting, handling and guidance of the housing;
    meter engaging means within the housing and secured thereto for engaging an electric meter to be installed while a portion of the meter projects through said opening;
    releasing means accessible from outside the housing and cooperating with said meter engaging means to facilitate disengagement of an electric meter from the meter engaging means after the electric meter has been installed; and
    shield means detachably secured to said housing around the opening therein;
    female lugs carried on said shield means; and
    male tabs carried on said housing and engaging said female lugs when said housing is rotated relative to said shield means to effect said detachable securement of the shield means to said housing.

13. An electric meter installing device as defined in claim 12 and further characterized as including:
    ribs carried on said shield means; and
    protuberances carried on said housing and frictionally engaging said ribs when said housing is detachably secured to said shield means.

14. An electric meter installing device as defined in claim 13 wherein said shield means is an annular, flat transparent plate, and is an electrical non-conductor.

15. An electric meter installing device as defined in claim 14 wherein said hollow transparent housing is an open ended cylinder having said annular shield secured around the opening at the open end thereof.

16. An electric meter installing device as defined in claim 15 wherein said meter engaging means is secured to the opposite end of said housing from said open end.

17. An electric meter installing device as defined in claim 16 wherein said meter engaging means is a suction cup.

18. An electric meter installing device as defined in claim 17 and further characterized as including a rigid backup ring concentrically surrounding said suction cup and adapted to bear against an electric meter pressed against said suction cup.

19. An electric meter installing device as defined in claim 17 and wherein said releasing means includes a releasing finger extending from said suction cup through said housing and facilitating the release of said suction cup from engagement with an electric meter to be installed.

20. An electric meter installing device as defined in claim 19 and further characterized as including a rigid backup ring concentrically surrounding said suction cup and adapted to bear against an electric meter pressed against said suction cup.

21. An electric meter installing device as defined in claim 20 wherein said suction cup includes an annular gripping edge, and said handle means includes a pair of handles extending from opposite sides of said housing in substantially the same plane as said gripping edge.

22. An electric meter installing device as defined in claim 21 wherein said releasing finger and suction cup are an integral unit of elastomeric material.

23. An electric meter installing device comprising:
a shield plate having an opening therethrough;
a hollow, open sided housing secured to said shield plate with the open side thereof aligned with the opening through said shield plate;
handle means on said housing;
a suction cup secured to the opposite side of said housing from the open side thereof; and
releasing means accessible from outside the housing for disengaging an electric meter from said suction cup.

24. An electric meter installing device comprising:
an annular, transparent shield plate having a central opening therethrough;
a hollow, open sided housing detachably secured to said shield plate with the open side thereof aligned with the opening through said shield plate;
handle means on said housing;
meter engaging means in said housing for engaging an electric meter to be installed with said installing device; and
releasing means carried by said housing and facilitating release of an electric meter from engagement with said meter engaging means.

* * * * *